US006807651B2

(12) United States Patent
Saluja et al.

(10) Patent No.: US 6,807,651 B2
(45) Date of Patent: Oct. 19, 2004

(54) PROCEDURE FOR OPTIMIZING MERGEABILITY AND DATAPATH WIDTHS OF DATA FLOW GRAPHS

(75) Inventors: Sanjeev Saluja, Jalvayu Vihar (IN); Anmol Mathur, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 23 days.

(21) Appl. No.: 10/172,941

(22) Filed: Jun. 17, 2002

(65) Prior Publication Data

US 2003/0061574 A1 Mar. 27, 2003

Related U.S. Application Data

(60) Provisional application No. 60/298,536, filed on Jun. 15, 2001.

(51) Int. Cl.[7] ............................................. G06F 17/50
(52) U.S. Cl. ......................... 716/2; 716/5; 716/18
(58) Field of Search ............................. 716/1, 2, 3, 4, 716/5, 6, 7, 18, 15, 8, 10, 9, 11, 17; 717/156, 158, 160, 155

(56) References Cited

U.S. PATENT DOCUMENTS

| | | | |
|---|---|---|---|
| 4,766,566 A | | 8/1988 | Chuang |
| 4,972,314 A | | 11/1990 | Getzinger et al. |
| 5,175,843 A | | 12/1992 | Casavant et al. |
| 5,197,127 A | | 3/1993 | Waclawsky et al. |
| 5,550,749 A | | 8/1996 | Dey et al. |
| 5,581,762 A | | 12/1996 | Hayashi et al. |
| 5,606,698 A | | 2/1997 | Powell |
| 5,619,692 A | * | 4/1997 | Malkemus et al. ............ 707/2 |
| 5,666,535 A | | 9/1997 | Komori et al. |
| 5,668,948 A | | 9/1997 | Belknap et al. |
| 5,729,466 A | | 3/1998 | Bamji |
| 5,742,814 A | | 4/1998 | Balasa et al. |
| 5,870,308 A | * | 2/1999 | Dangelo et al. ............... 716/18 |
| 6,026,228 A | | 2/2000 | Imai et al. |
| 6,192,504 B1 | | 2/2001 | Pfluger et al. |
| 6,216,252 B1 | * | 4/2001 | Dangelo et al. ............... 716/1 |
| 6,237,021 B1 | | 5/2001 | Drummond |
| 6,421,809 B1 | * | 7/2002 | Wuytack et al. ............... 716/2 |
| 6,463,560 B1 | * | 10/2002 | Bhawmik et al. ............ 714/733 |
| 6,505,328 B1 | | 1/2003 | Van Ginneken et al. |

OTHER PUBLICATIONS

Kim et al (IEEE Transactions on computer–aided design of integrated circuits and system, vol. 17, No. 10 Oct. 1998).*

Kim et al (IEEE Transactions on computer–aided design of integrated circuits and system, vol. 19, No. 5, May 2000).*

Taewhan et al (IEEE Transactions on computer–sided design of integrated circuits and system, vol. 17, No. 10 Oct. 1998).

Taewhan et al (IEEE Transactions on computer–sided design of integrated circuits and system, vol. 19, No. 5 May 2000).

Huffman, D. A., "A Method for the Construction of Minimum–Redundancy Codes" *Proceedings of the IRE*, (1952) 40(9):1098–1101.

Kim, Y. and T. Kim, "Accurate Exploration of Timing and Area Trade–offs in Arithmetic Optimization using Carry–Save–Adders" *IEEE* (Feb., 2001) pp. 622–627.

(List continued on next page.)

*Primary Examiner*—Vuthe Siek
*Assistant Examiner*—Binh C. Tat
(74) *Attorney, Agent, or Firm*—Bingham McCutchen LLP

(57) ABSTRACT

Required precision and information content of datapath signals are used to define functionally safe transformations on data flow graphs. These transformations reduce widths of datapath operators and edges and enhance the mergeability of operators. An algorithm for optimally balancing data flow graph topology to further reduce the data path widths and further enhance mergeability is combined with the above in an iterative algorithm for optimizing DFGs.

12 Claims, 7 Drawing Sheets

OTHER PUBLICATIONS

Kim, Y. and T. Kim, "An Accurate Exploration of Timing and Area Trade–Offs in Arithmetic Optimization using Carry–Save Adder Cells" *Proc. 43$^{rd}$ IEEE Midwest Symp. on Circuits and Systems*, Lansing, Michigan, (Aug., 2000) pp. 338–341.

Kim, T. et al., "Circuit Optimization Using Carry–Save–Adder Cells" *IEEE* (Oct., 1998) 17(10):974–984.

Kim, T. et al., "Arithmetic Optimization using Carry–Save–Adders" *Proceedings of the 35$^{th}$ Design Automation Conference* (1998) pp. 433–438.

Klauser, A. and D. Grunwald, "Instruction Fetch Mechanisms for Multipath Execution Processors" *IEEE* (1999) pp. 38–47.

Koch, A., "Structured Design Implementation—A Strategy for Implementing Regular Datapaths on FPGAs" *FPGA '96 Monterey, CA* (1996) pp. 489–513.

Omondi, A.R., "Computer Arithmetic Systems: Algorithms, Architectures and Implementations" (1998) Appendices A & B, Prentice–Hall International Series in Computer Science, Hertfordshire, United Kingdom.

Rudolph, M. et al., "Test Scheduling and Controller Synthesis in the CADDY–System" *IEEE* (1991) pp. 278–282.

Rundensteiner, E. A. and D.D. Gajski, "Functional Synthesis Using Area and Delay Optimization" *29$^{th}$ ACM/IEEE Design Automation Conference* (1992) pp. 291–296.

Um, J. et al., "Optimal Allocation of Carry–Save–Adders in Arithmetic Optimization" *Proceedings of International Conference on Computer Aided Design* (1999) pp. 410–413.

Um, J. et al. "A Fine–Grained Arithmetic Optimization Technique for High–Performance/Low Power Data Path Synthesis" *Proceedings of the 37$^{th}$ Design Automation Conference* (2000) pp. 98–103.

Wallace, C. S., "A Suggestion for a Fast Multiplier" *IEEE Transactions on Electronic Computers* (Feb., 1964) EC–13:14–17.

Weste, N. and K. Eshraghian, "Principles of CMOS VLSI Design—A System Perspective" (1985) pp. 366, 389–391, 401–402, Addition Wesley Publishing Company, Reading, MA.

Willems, M. et al., "System Level Fixed–Point Design Based on an Interpolative Approach" *Proceedings of the 34$^{th}$ Design Automation Conference* (1997) pp. 293–298.

International Search Report, PCT/US02/19138, Cadence Design Systems, Inc., Oct. 6, 2003.

* cited by examiner

PROCEDURE FOR OPTIMIZING MERGEABILITY AND DATAPATH WIDTHS OF DATA FLOW GRAPHS

CLAIM OF BENEFIT OF PROVISIONAL APPLICATION

The present application claims the benefit of U.S. provisional patent application U.S. Ser. No. 60/298,536, which was filed on Jun. 15, 2001, and is incorporated by reference herein.

BACKGROUND

The number and complexity of datapath operations implemented in various kinds of systems, particularly those on integrated circuit chips, has increased considerably over the years. This is especially true in chips used for graphics, communication, and multimedia processing applications, which have employ parallel implementation of signal processing algorithms such as fast Fourier transforms, finite impulse response filters and other DSP algorithms.

One perennial need in this field is in the optimization of datapath operations to minimize area, power requirements, and delay. Current techniques are limited in scope, permitting only the merging of individual datapath operators such as adders, multipliers, and shifters. For example, datapath-intensive register transfer level (RTL) designs require synthesis techniques that yield optimized implementations of groups of datapath operators instead of individual operators.

One useful technique is operator merging, which refers to clustering of multiple datapath operators so that they can be synthesized together as a unit. In particular, designers and researchers have explored synthesizing a cluster of datapath operators as a sum of addends using carry-save adders and Wallace trees. For example, synthesis of the sum of product expression a*b+c*d using traditional synthesis requires 2 multipliers and an adder. Such an implementation has 2 carry-propagate adders on any input-to-output path. Operator merging can implement such an expression using only one carry-propagate adder by reducing the partial products of the multipliers in a single carry-save reduction tree (CSA-tree).

An algorithm for operator merging to achieve datapath synthesis has also been proposed which first partitions a data flow graph into clusters of datapath operators and then synthesizes each cluster using a CSA-tree, that is, a combination of a reduction tree of carry-save adders and a final adder.

The effectiveness of operator-merging in improving performance of netlists for datapath intensive designs has been demonstrated. Research has also focussed on the optimal implementation of synthesizing clusters of datapath operators as sums of addends using carry-save adders and bit-oriented Wallace trees. Such work has further supported the usefulness of operator merging.

The problem of optimization of datapaths is a deep problem and will continue to demand attention from researchers. There is thus a continuing need for improvements in the various approaches.

SUMMARY OF THE INVENTION

Partitioning a data flow graph into clusters is a preliminary step in the optimization of datapaths. Operator merging maximizes the mergeability of operators to permit larger and fewer clusters to be defined by optimization procedures. Each cluster representing a sum of addends is associated with the burdensome delay and area of a final carry-propagate adder. Partitioning of datapaths into larger numbers of small clusters generally means more timing delay and area of the resulting netlist. In contrast, increased merging may provide reductions in the number of carry-propagate adders and consequently reduced critical path delay.

In the present specification, several techniques are proposed for partitioning data flow graphs into clusters. In particular, the techniques allow safe reduction in the bit-widths of datapath operators used in designs. This allows the first pass of synthesis to generate faster and smaller netlists. They also reduce the amount of work at the gate-level logic optimization step required to meet timing and area constraints. Further, the proposed method of partitioning a data flow graph into maximal mergeable clusters also defines criteria for safe partitioning of data flow graph and these may be used in problem scenarios other than operator merging. For example, they may be used for rebalancing computation graphs consisting of associative operators.

Safe clustering of data flow graphs (DFGs) is characterized in terms of required precision and information content of signals. This characterization is applicable to DFGs that have both signed and unsigned extensions of signals. Note that signed extension refers to adding higher significant bits by replicating the sign bit and unsigned refers to adding higher significant bits by adding zeros. The basic formulas and processes, based on notions of required precision and information content of a signal, are used to define safe, functionality-preserving, transformations on the DFGs, which allow the transformed graph to have potentially smaller widths (bitwidths) of datapath operators and potentially greater mergeability of datapath operators. Efficient algorithms for computation of required precision and upper bounds on information content and the related DFG transformations are proposed. These algorithms may be combined in an iterative procedure for partitioning a graph into maximal safe clusters.

The inventions will be described in connection with certain preferred embodiments, with reference to the following illustrative figures so that it may be more fully understood. With reference to the figures, it is stressed that the particulars shown are by way of example and for purposes of illustrative discussion of the preferred embodiments of the present invention or inventions only, and are presented in the cause of providing what is believed to be the most useful and readily understood description of the principles and conceptual aspects of the invention or inventions. In this regard, no attempt is made to show structural details of the invention in more detail than is necessary for a fundamental understanding of the invention or inventions, the description taken with the drawings making apparent to those skilled in the art how the several forms of the invention or inventions may be embodied in practice.

BRIEF DESCRIPTIONS OF THE DRAWINGS

DETAILED DESCRIPTION OF THE INVENTION

Figure 1A:
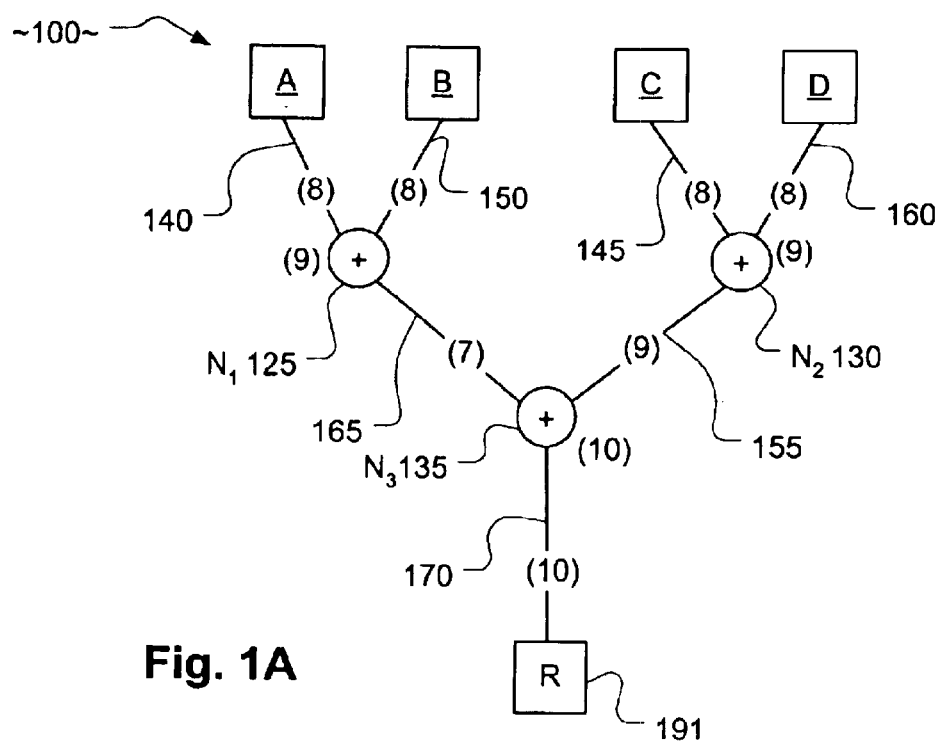
FIG. 1A illustrates a simple data flow graph (DFG) with a bottleneck that prevents merging according certain criteria.

Operations of a data flow graph (DFG) may include width extension of a signal, which is the padding the most significant bit (MSB) side of the signal with multiple copies of a fixed bit to obtain a new signal of larger bitwidth. If the padding is done with a zero bit, the extension may be said to be unsigned. If it is done with the current MSB of the original signal, the extension may be said to be signed. For example, 00011 and 11111 are obtained from the two bit signal 11 by a five bit unsigned and five bit signed extension respectively.

As used in the instant specification, a DFG, which includes datapath operators, is a directed acyclic connected graph where nodes represent inputs, outputs and datapath operations. The term "edges" is used to identify the flow paths for data between operators. The interface of an edge with its source or destination node is referred to as a port. A port may be an input (or output) port representing an interface of an edge with its destination (resp. source) node. Each input (or output) node may have one output (resp. input) port. Each operator node may have one output port and one or two input ports depending on whether the datapath operator on the node is unary or binary. The following quantities may be defined for the nodes and edges in a DFG:

Each operator node N may have a width value w(N), which is a positive integer. For an input (or output) node, represents the bitwidth of the input (resp. output) signal represented by the node. For an operator node, it represents the number of bits used to represent the operands and/or result of the operation labeling the node.

Each edge e has a width value w(e), which is a positive integer. For an edge, the width represents the number of least significant bits of the result of the operation at the source node, which may be used as input by the operation at the destination node of the edge.

Each edge e may be labeled with a binary attribute t(e) called the signedness of the edge. The signedness is either signed or unsigned. The binary bits {0, 1} may be used to represent the signedness types "unsigned" and "signed," respectively.

Let $N_1$ and $N_2$ be the source and destination nodes of an edge e. Let their widths be $w(N_1)$, $w(N_2)$ and $w(e)$ respectively. If $w(e) \leq w(N1)$, then a signal defined by w(e)—many least significant bits of the result of $N_1$, may be said to be carried by e. If $w(e) > w(N_1)$, then e would carry a signal obtained by extending the result of $N_1$ to w(e) width. The type of extension may be determined by the signedness of the e. Similarly if $w(N_2) \leq w(e)$, the signal defined by $w(N_2)$—many least significant bits of the signal carried by e may be used as an input operand by the operator at the destination node. If $w(N_2) > w(e)$ and implementation of the operator at $N_2$ requires an extension of its operand, then a $w(N_2)$ bit extension (whose signedness is determined by signedness of e) of the signal carried by e may be used as the input operand.

Referring to FIG. 1A, the idea of merging of datapath operators may be illustrated with a simple example. A DFG 100 has inputs A and B linked by edges 140 and 150, respectively, to an operator $N_1$ illustrated at 125. DFG 100 has inputs C and D linked by edges 145 and 160, respectively, to an operator $N_2$ illustrated at 130. Operators $N_1$ and $N_2$ 125 and 130 are illustrated as addition operators but could any of a variety of types of operators. The bitwidths of edges 140, 145, 150, and 160 are each equal to 8. The widths of operators $N_1$ and $N_2$ 125 and 130 are equal to 9. While an output edge 155 has a bitwidth of 9, which corresponds to the output of operator $N_2$ 130, that of an output edge 165, which corresponds to the output of operator $N_1$ 125, is equal to 7 so the output of node $N_1$ 125 is obtained by truncating a 9 bit result to 7 bits by the operator $N_1$ 125. Furthermore on the edge 165, the truncated value may be sign-extended to 9 bits to be used as an operand for the operator $N_3$ 135. The output edge 170 of the operator $N_3$ 135 indicated at 170 has a bitwidth of 10, corresponding to a result R.

Figure 1B:
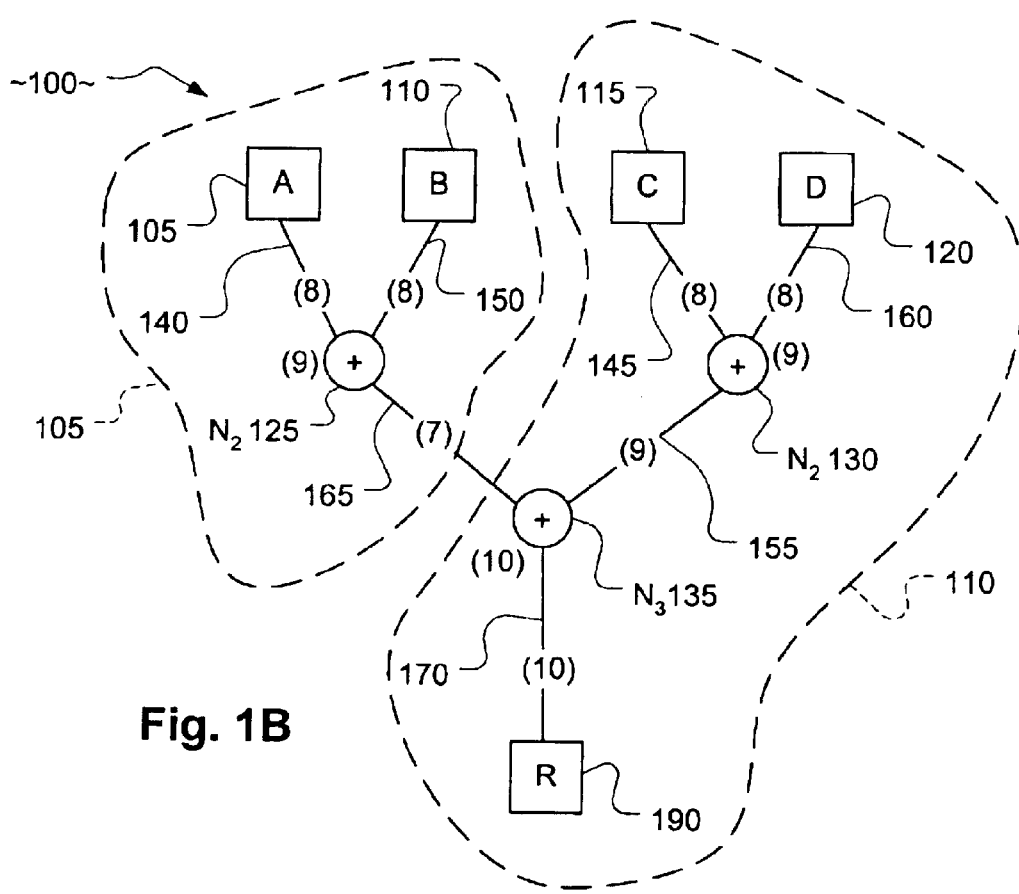
FIG. 1B illustrates the DFG of FIG. 1B highlighting what may be deduced to be non-mergeable features.

Observe that because the truncated value carried by the edge 165 may be sign-extended to 9 bits, to be used as an operand for operator $N_3$ 135, the output 190 of the DFG 100 is not directly expressible as sum of addends derived from input signals. Therefore, the whole of the DFG 100 could not be in the same cluster. That is, it is not mergeable. Referring now to FIG. 1B, the maximal merging possible in the DFG 100 is identified by broken lines 105 and 110 surrounding the mergeable extents. The situation where a signal is truncated and then subsequently extended in the downstream computation creates a mergeability bottleneck and forces a boundary that limits merging.

The following two essential conditions may be identified as being required for a set of datapath operators in a DFG to be identified as a cluster:

1. The subgraph formed by the operators is a connected induced subgraph with a unique output.
2. The value of the output signal, at the unique output, is definable as a mergeable function of inputs to the cluster.

For example, this function may be a sum of products of signals derived from inputs. Note that an addend may be said to be derived from an input signal if it is obtained by truncation, extension or 2's complement of the input signal of products of signals derived from inputs. Note also that since a product operation can be implemented as sum of multiple partial products, a sum of products of signals may be viewed as a sum of addends, where the partial product of inputs form the addends.

Figure 2A:
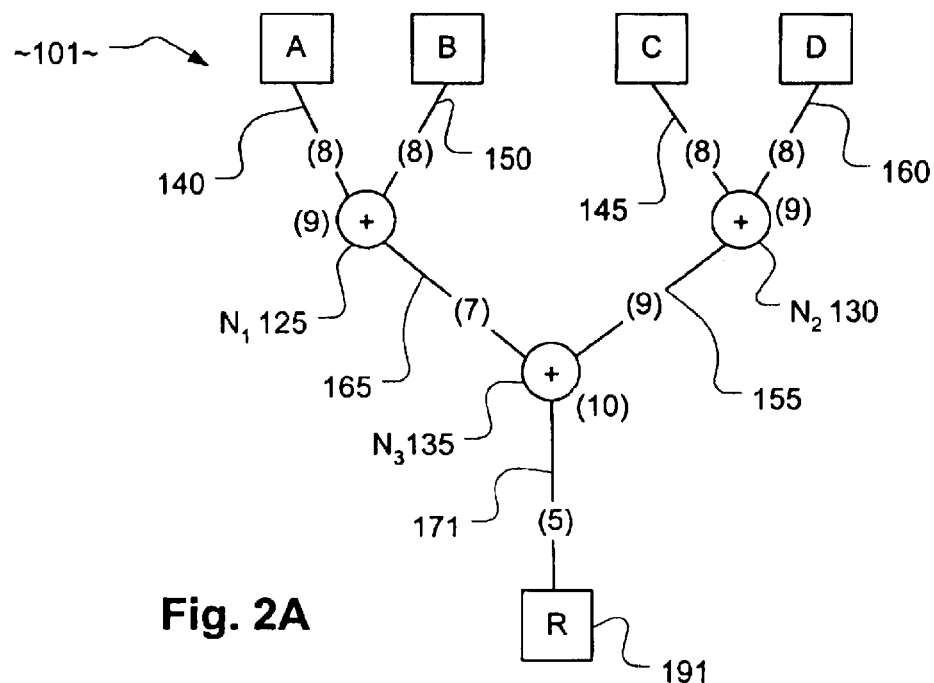
FIGS. 2A and 2B illustrate the transformation of a DFG similar to that of FIGS. 1A and 1B into a DFG that may be deduced to be mergeable by virtue of the elimination of the purported bottleneck.
Figure 2B:
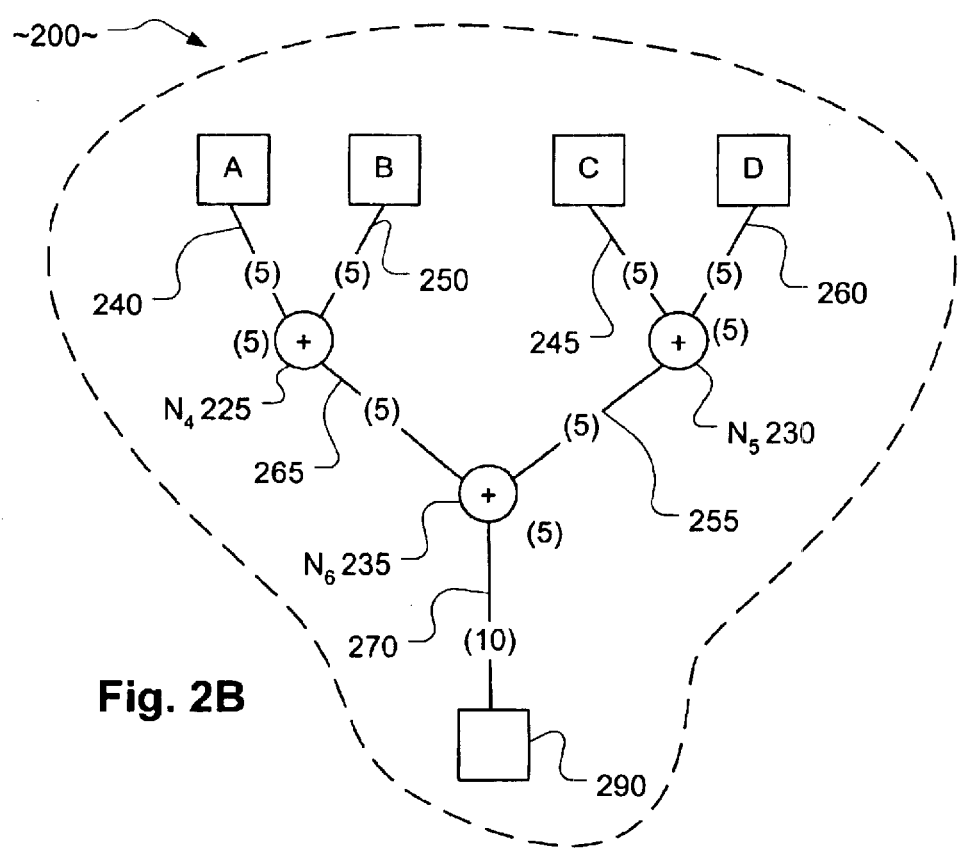

Referring to FIGS. 2A and 2B, a DFG 101 is similar to that of FIGS. 1A and 1B, except for a difference in the width of an output edge 171, which is 5 bits in FIG. 2A rather than 10 as in FIGS. 1A and 1B. Since only 5 LSBs of the final sum 191 need to be generated, the required precision of every signal in the DFG 101 is only 5 bits. This is because the higher significance bits are superfluous. Hence no extension is required on the edge 165 and the bottleneck of FIGS. 1A and 1B may be seen to be avoidable by appropriate transformation of the DFG 101. Thus, the entirety of the DFG 101 is mergeable. The DFG 101 may be transformed to the DFG 200, which has smaller respective widths of edges 240, 250, (which correspond to edges 140 and 150), edges 245 and 260 (which correspond to edges 145 and 160), operators $N_4$ and $N_5$ 225 and 230 (which correspond to operators $N_1$ and $N_2$ 125 and 130) and edges 265 and 255 (which correspond to edges 165 and 155) compared to the DFG 101. The transformed DFG 200 may then be analyzed using prior art mergeability algorithms and clusters identified and merged.

Note that, although in this example the width of the output signal 191 is used to transform the width of the operators of the DFG 200, the width of any node or edge inside the DFG can also be used to transform the widths of nodes and edges in the fan-in cone of the given node (or edge, respectively). Essentially, a procedure may be followed in which, working backward from output to input, where an operator and/or its inputs are wider than required given the width of the output, the operator and its inputs are pruned. For example, if an 8-bit-wide operator with inputs whose widths are also 8 bits, has an output that is only 6 bits wide, the operator and its inputs may be pruned to 6 bits, which is the minimum precision required for the output. Any additional width results in the operator ignoring MSBs of the inputs, so they are pruned in advance. Then the pruned inputs are followed to their respective outputs and the same process is followed again for each operator, pruning along the way. Note, the procedure may not hold for all operator types, for example shift and rotate operators.

The following procedure is preferably recursive and, as suggested above, applied in bottom up fashion, i.e. the ports on the output nodes form the base case. For an input or output port p, a required precision r(p) for the signal entering or leaving the port, respectively, is defined by the following rules:

For input port p of an output node N: r(p)=w(N).

For input port p of a non-output node N: r(p)=min {r($p_o$); w(N)}. Here $p_o$ is the output port of N.

For output port $p_o$ of a node N:

$$r(p_o) = \max_{e \in Coutedges(N)}(\min \{w(e); r(p_d)\})$$

Here $p_d$ denotes the input port at the destination node of edge e.

Figure 3:
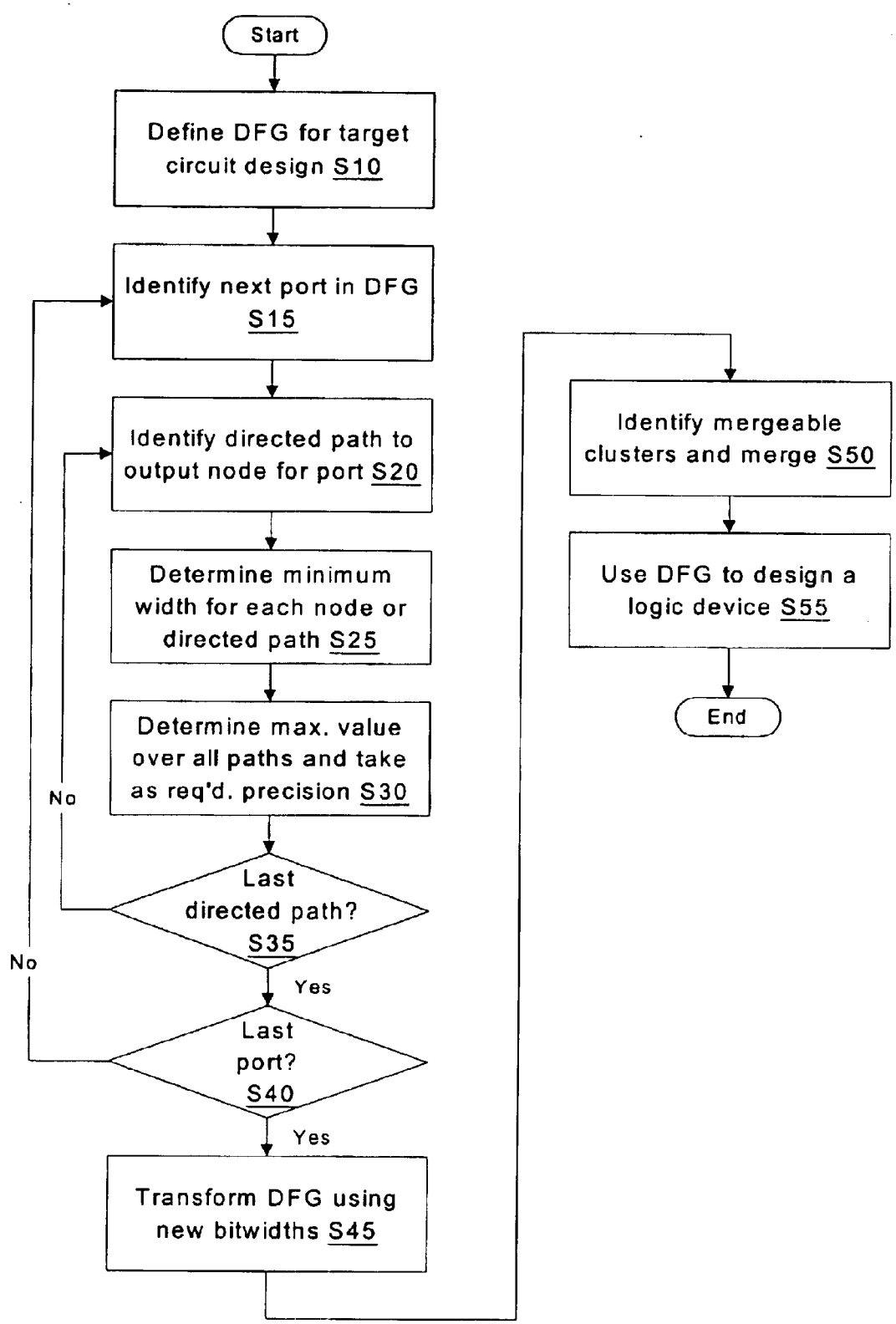
FIG. 3 is a flow chart illustrating a method for enhancing the mergeability of a DFG by identifying required precision and transforming the DFG accordingly.

Referring to FIG. 3, a procedure for implementing the above in a design for a circuit may be defined as follows. In step S10, a DFG is defined to represent a proposed circuit. In step S15, a new port in the DFG is identified. Preferably, the nodes of a DFG are processed in reverse topological order. As stated, the ports are traversed in bottom-up fashion with the outputs taken first. In step S20, a new directed path from the port to an output node is identified. Note that the directed path may be confined to the immediate fan-out region, or a selected number of levels of such, of the node.

In step S25, the minimum width of any node or edge on that path is determined. Then, in step S30, the required precision is taken as the maximum of this value over all of these directed paths. If the required precision of a signal is n, it means, not more than n least significant bits of the signal are needed to completely define the signals at every output node in the fan-out cone of the port. The remaining higher order bits of the signal get truncated by some intermediate operation or explicit truncation and the corresponding bits on subsequent paths may be regarded as superfluous. In step S35, if the last directed path from the current port has been followed, step S40 is executed, if not, steps S20–S30 are repeated for a new one, until all are followed out and a required precision determined for each. In step S40, if the last port has been traced, step S45 is executed, if not, steps S20–S35 are repeated for a new one, until all are followed out and a required precision determined for each directed path therefrom.

In step S45, the DFG is transformed according to the new required precision values by applying each to a corresponding operator and edge. A transformation that changes the widths of nodes and edges in a DFG such that $$w(n)=\min\{w(n); r(p_o)\} \text{ and } w(e)=\min\{w(e); r(p_d)\}$$

where $p_o$ is the output port of node n and $p_d$ is the destination port of edge e preserves the functionality of the DFG. In step S50, mergeable clusters may be identified based on the transformed DFG and in step S55, the transformed DFG may be used as a basis for the design of a logic circuit, as an exemplary application of the method.

As demonstrated by the examples given, analysis of required precision of a DFG graph can potentially reduce the required width of operators and operands and thereby expose the mergeability of operators to algorithms for identifying clusters.

Figure 4A:
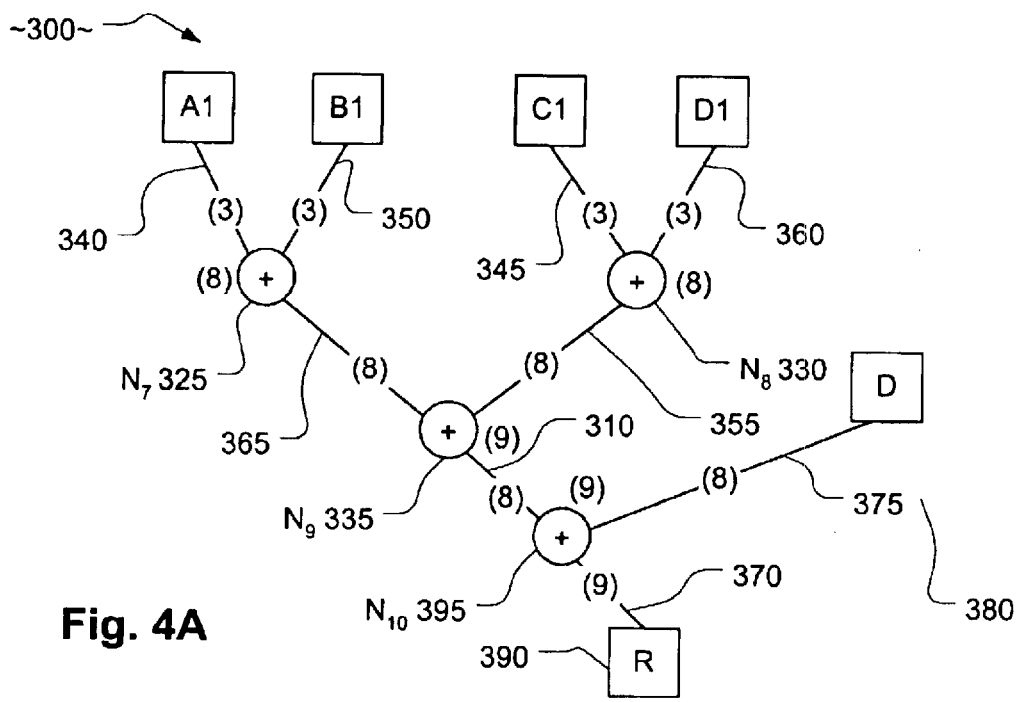
FIG. 4A illustrates a DFG for purposes of discussing information content.
Figure 4B:
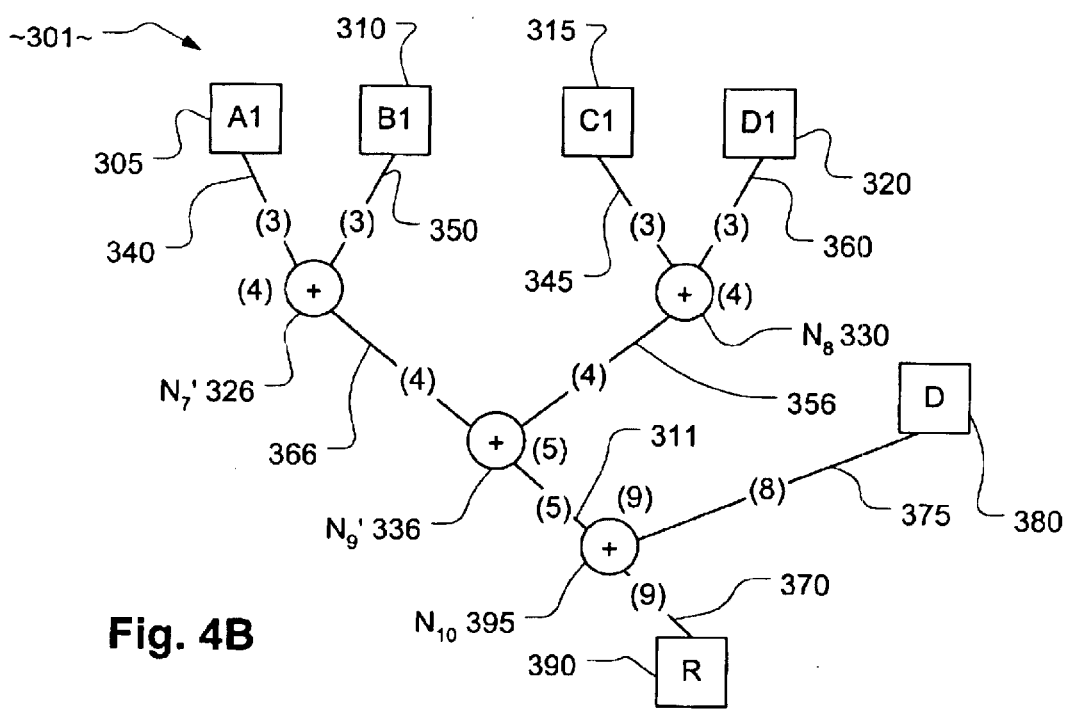
FIG. 4B illustrates the DFG of FIG. 3A after transforming to reduce bitwidths to a minimum required to preserve information content.

Referring now to FIGS. 4A and 4B, a simple example of a DFG 300 has inputs A1, B1, C1, and D1 applied through edges 340, 350, 345 and 360 to operators $N_7$ and $N_8$ 325 and 330, respectively. Outputs of operators $N_7$ and $N_8$ 325 and 330 are applied through edges 365 and 355 to an operator $N_9$ 335, whose output is applied through edge 310 to an operator $N_{10}$ 395, whose output at edge 370 is a result 390. Note that the edge 310 appears at first inspection as a potential boundary of merging (i.e., a bottleneck), because it is sign-extending an 8 bit truncated sum. However since A1, B1, C1, and D1 all have narrow bitwidths, the 8-bit result of nodes $N_7$ 325 and $N_8$ 330 are simply sign extensions of 4 bit sums. Tracing the consequences of this observation one level further, the result of $N_9$ 335 is, functionally, a sign-extension of 5 bit sum. This means, the combination of the widths of node $N_9$ 335, edge 310 and node $N_{10}$ 395 does not required a sign-extension of a truncated result as may first appear. In fact, the operand entering $N_9$ 335 via edge 365 is a sign extension of 5 bit sum. As a result, DFG 300 may be replaced with a functionally equivalent graph 301, which has smaller widths for operators $N_7$' and $N_9$' 326 and 336 and edges 366, 311, and 356. Further, output R 390 may be expressed as sum of sign-extensible inputs A1, B1, C1, and D1 and the entire graph is, thus, mergeable.

The example illustrates that essential content of information in the result of every operator node may be transformed, in some situations, to allow the merging of operators that otherwise seem unmergeable. Also, as noted in the context of preceding example, the same analysis also allows a reduction in the widths of datapath operators that are working on operands with low information content. An algorithm is described below for defining and exploiting an upper bound on the information content of signals at every port of a DFG. This information content results may then be used to prune the widths of nodes and edges in the DFG safely.

The information content of a signal in a DFG may be defined as the tuple <i,t> of the smallest possible non-negative integer i and an extension type t $\epsilon\{0; 1\}$ (i.e. unsigned, signed) such that for all possible values of the inputs to the DFG, the signal is a t-extension of its i many least significant bits. For a port p, <i(p), t(p)> may denote the information content of the signal entering (or leaving) the port if the port is an input (resp. output) port. Intrinsic information content of a node may be defined as the information content of its result signal in terms of the information content of its operands, assuming the operation at the node is done without any loss of information. For example, intrinsic information content $i_{int}$ of addition of operands with information contents $<m_1, 0><m_2, 0>$ is $<\max\{m_1, m_2\}+1, 0>$, again, the value 0 for t a signedness of unsigned. The problem of determining the first component of information content of signals in an arbitrary DFG with +, − and × operators is nondeterministic polynomial-hard (NP-hard), which means it is essentially intractable. But, while computing the exact value (say <i, t>) of information content is hard, a heuristic for efficiently computing an upper bound on information content i.e. a <i', t'> where i'≧i such that the signal is a t'-extension of its i' many least significant bits, is still possible.

The notation $\hat{i}(p)$ (similarly $\hat{i}(N)$ and $\hat{i}_{int}(N)$) may be used to denote upper bounds on the information content <i(p), t(p)> of a port. If the upper bounds on intrinsic information content of inputs of binary operators of addition (+), subtraction (−), multiplication (×), and unary minus(−$_u$), are denoted by $<i_1, t_1>$, $<i_2, t_2>$ then:

$\hat{i}_{int}(+) = <\max\{i_1, i_2\}+1, t_1|t_2>$;

$\hat{i}_{int}(-) = <\max\{i_1, i_2\}+1, \text{signed}>$;

$\hat{i}_{int}(\times) = <i_1+i_2, t_1|t_2>$;

$\hat{i}_{int}(-_u) = <i_1+i_2, \text{signed}>$.

Note that the vertical bar refers to a Boolean OR operation so that if any input is signed, then the output information content is signed.

Information content of a signal at the output edge of an operator node may depend on the width of the operator node and information content of the input operands of the operator node. As a consequence, the information content of signals are preferably computed in a given DFG in a top-down order; i.e. starting at input nodes and finishing at output nodes.

Figure 5:
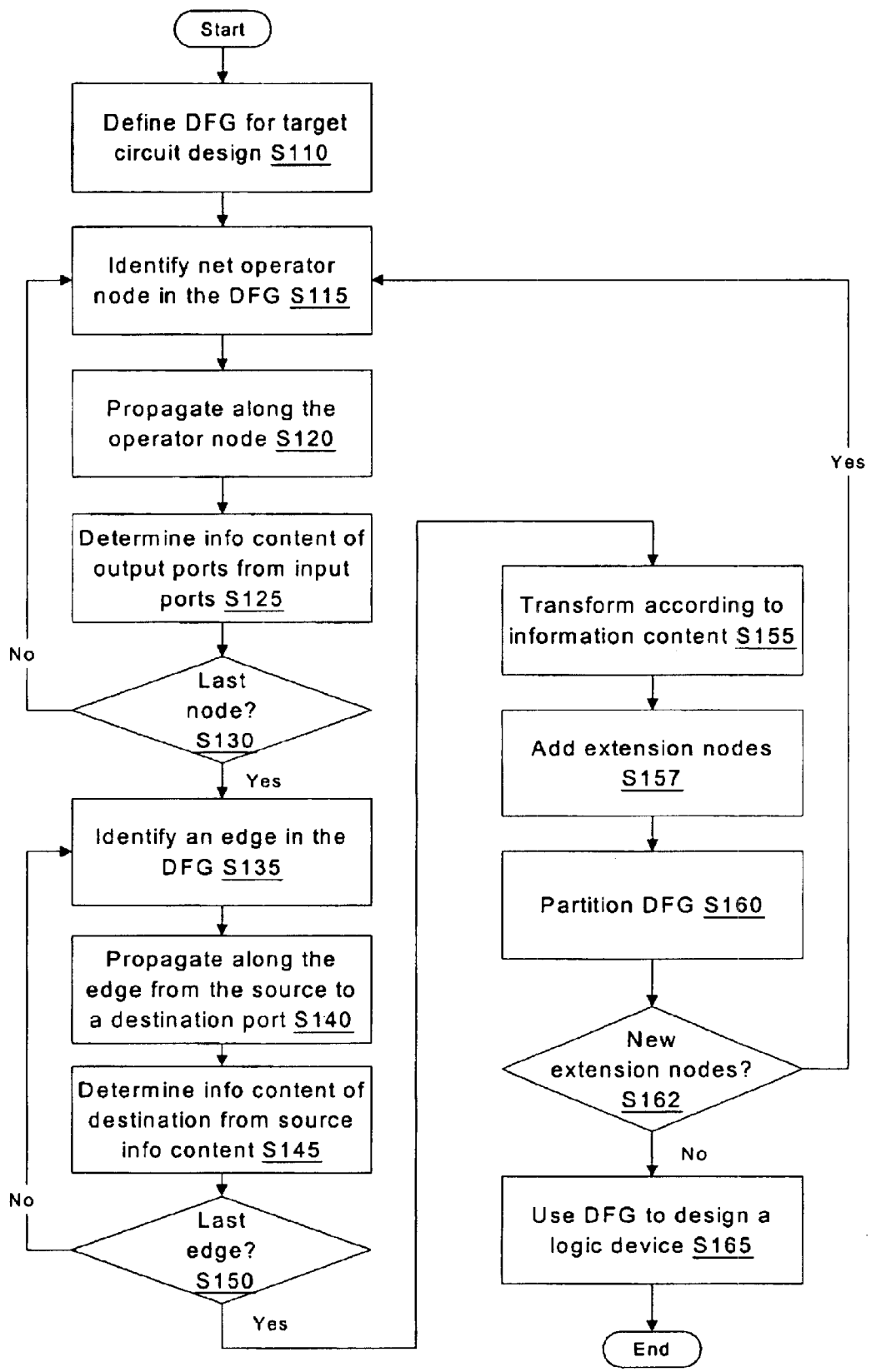
FIG. 5 is a flow chart illustrating a method for transforming a DFG based an upper bound on information content.

Referring to FIG. 5, a procedure for optimizing a design for a logic device begins with the definition of a DFG S110 and identifying an next operator node S115 in an output-to-input sequence. In steps S120 and S125, propagating information content across an operator node, information content for the output port of the nodes are computed based on the information content of the inputs ports of the operator node. The information content at the output port of a node is the smaller of the intrinsic information content of the node and its width. If at step S130 the last operator node has been identified and its output port information content determined, step S135 is executed. If not, steps S115–S125 are repeated for each.

At step S135, an edge is identified in the DFG. In steps S140 and S145, propagating information content across an edge, information content for the destination port of the edge is computed based on the information content for the source port of the edge. For propagating information content across an edge, if the signedness of the information content and the edge are the same, then the magnitude of the information content across the edge is the smaller of upper bound on i and $w_e$. In the scenario where the signedness type t of the information content at the source port differs from signedness type t(e), when t=unsigned and t(e)=signed, if there is a strict extension of the information content across the edge (i.e. $w(N_1)$>upper bound on i and w(e)>upper bound on i), then the first component of the information content is upper bound on i and the signedness is unsigned. Even though the edge is signed, in this case, the data going into the destination node can be regarded as unsigned because it will always have zeros in the most significant bits beyond the upper bound on i least significant bits. If, at step S150, the last edge has been identified and its information content determined, step S155 is executed. If not, steps S135–S145 are repeated for each edge.

Information content upper bound is used to reduce the widths of nodes and edges in the DFG at step S155, when widths exceed the information content. In step S157, to maintain compatible connections between a pruned subgraph and its inputs and outputs, a new type of operator may be defined and added to reconcile the interfaces, as required. This operator is referred to here as an extension node. The extension node may have the following two attributes: width and signedness (denoted by w(N) and t(N) for node N), may be defined such that the result of extension operation is:

(i) if $w(N) > w(e_{in})$ (where $e_{in}$ is the unique input edge of the node), then result is a w(N) bit extension of the signal at the destination port of e and the type of extension is same as t(N).

(ii) if $w(N) \leq w(e_{in})$, then result is the w(N) many least significant bits of the signal on destination port of e.

If the intrinsic information content of an operator node N is <i, t> and w(N)>i, then a transformation can be done without changing functionality of the DFG. This transformation begins by decreasing the width of N to i. Then, all the outedges of N may be removed. The output port of N is then connected to a new extension node and the removed outedges of N connected to the output port of the new extension node. The width and signedness type of the edge connecting N and the new extension node is <w(N), X> (where X means either of signed or unsigned); the width and signedness type of the new extension node are w(N) (old value) and t respectively. If the information content at the destination port of an edge in a DFG is <i, t>, the width and sign type of the edge can be changed to i and t without changing the functionality of the DFG. The width transformations above are preferably performed while evaluating the information content in topological order from inputs towards outputs.

In step S160, mergeable clusters are identified and merged (i.e., the DFG is repartitioned) and in step S162, if new extension nodes are added from a previous iteration, the information content is propagated across the extension nodes by returning to step S115 and iterating.

Figure 6A:
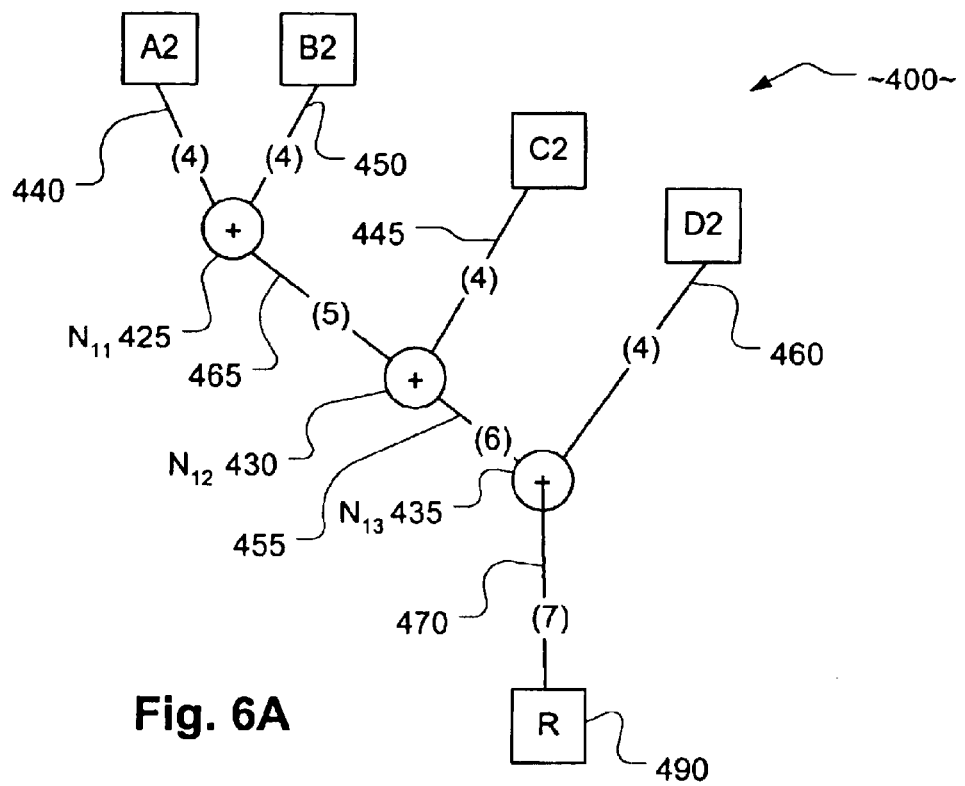
FIG. 6A illustrates a DFG for purposes of discussing constraints on apparent mergeability that arise from topology features.

There are situations, in which, a safe rebalancing of a subgraph of a DFG, can allow tighter (i.e. smaller) values of upper bounds on information content of signals. This may allow for potentially greater merging and smaller widths of operators. For example, consider the DFG shown in FIG. 6A, which, as in earlier examples, could be part of a bigger DFG.

In a DFG 400, inputs A2, B2, C2, and D2 are applied through edges 440, 450, 445 and 460 to operators $N_{11}$, $N_{12}$ and $N_{13}$ 425, 430, and 435, respectively. Output of operators $N_{11}$ 425 is applied through edge 465 to operator $N_{12}$ 430, whose output is applied through edge 455 to operator $N_{13}$ 435, whose output at edge 470 is a result 490. Note that the operators $N_{11}$, $N_{12}$ and $N_{13}$ 425, 430, and 435 form a skewed tree. The algorithm for computing information content would compute <7, 0> as the upper bound on information content of the output signal R 590.

Figure 6B:
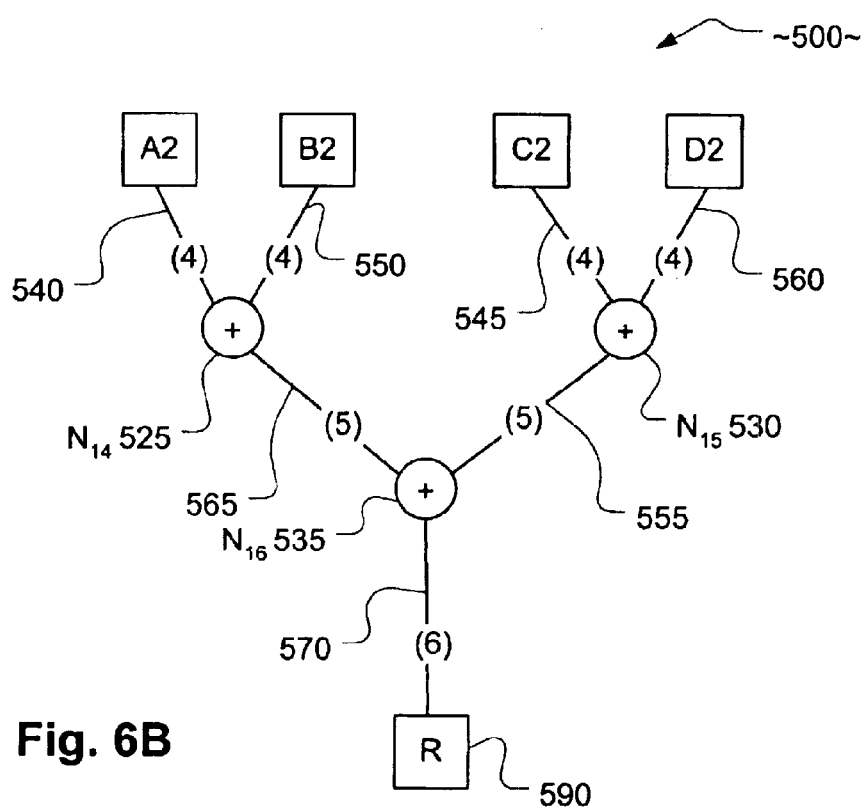
FIG. 6B illustrates the DFG of FIG. 4B after transforming it to change the topology to remove the apparent constraint.

However, the DFG 400 shaped as a skewed tree may be rebalanced as illustrated at 500 in FIG. 6B. Here, DFG 500 has inputs A2, B2, C2, and D2 applied through edges 540, 550, 545 and 560 to operators $N_{14}$ and $N_{15}$ 525 and 530, respectively. Outputs of operators $N_{14}$ and $N_{15}$ 525 and 530 are applied through edges 565 and 555 to an operator $N_{16}$ 535, whose output at edge 570 is a result 590. In the DFG 500, the upper bound computed would be <6, 0>. Note that a rebalancing of a subgraph in a DFG did not alter its functionality. Therefore once a subgraph has been identified as safely rebalanceable, the upper bounds on the output of the subgraph can be computed using a more balanced ordering of operations in the graph. Note also that actual rebalancing of the nodes and alteration of the graph is not required. The only requirement is to define a more balanced ordering of operators to compute tighter upper bounds.

Preferably, subgraphs should be rebalanced only if doing so is safe. A cluster obtained from mergeability analysis is a safely rebalanceable subgraph (for example, the subgraphs enclosed by boundaries 105 and 110 in FIG. 1B), because the output of a cluster is expressible directly as sum of products of input signals. Given a DFG consisting of addition, subtraction, multiplication and unary minus operators, a cluster such that its unique output is expressible as a sum of constant multiples of addends (for example z=5*b−4*d+3*f) is a safely rebalanceable subgraph because each constant integer product is equivalent to multiple addends coming from the same signal (e.g. 5*b is b+b+b+b+b and −4*d is (−d)+(−d)+(−d)+(−d)). Therefore, the output can be viewed as sum of addends derived from input signals.

After identifying clusters using an initial mergeability analysis, the information content of the output of the clusters can be computed by rebalancing them. Further, if this recomputation leads to reduction in the value of the width component of information content, further merging of operators should be attempted.

A computational problem exists which is how to compute tighter upper bounds on information content of a cluster representing a sum of constant multiples of inputs. An algorithm employs Huffman Rebalancing to take an expression representing a sum of constant multiples of input signals and compute an upper bound on the integer value of information content of the output signal using an optimal ordering of operations. The following is a definition of the proposed algorithm.

Figure 7:
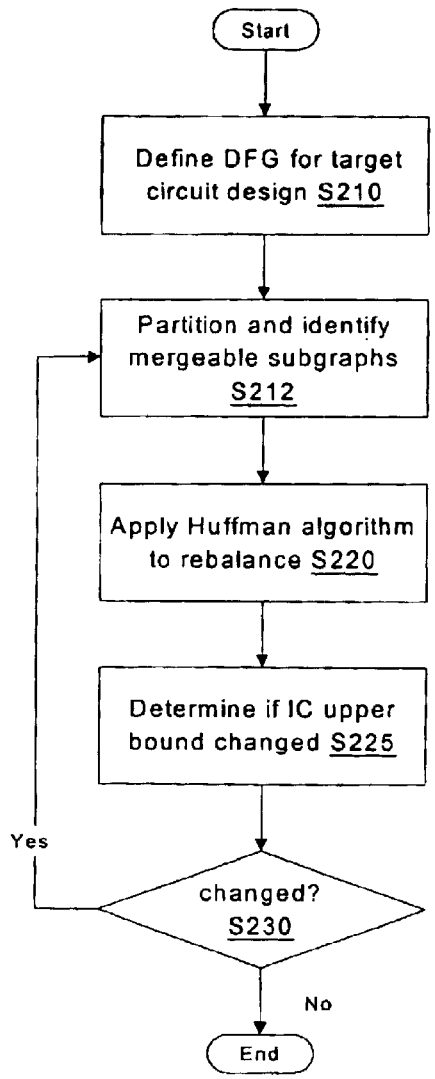
FIG. 7 is a flow chart illustrating a procedure for Huffman rebalancing of the topology of a DFG to permit greater reduction in bitwidths and improved mergeability.

The input to the algorithm is an expression representing a sum of constant multiples of input signals. The upper bounds on information contents of the input signals are assumed to be known. The output is an upper bound on information content of the output signal of the expression. Referring to FIG. 7, in step S210, a DFG is defined. In step S220, first, a priority heap structure H of integers is created. For each term c*i in the expression (where c is an integer constant and i is an input signal, c copies of the numeric value of information content of i are placed in the heap. Next, the following procedure, represented in pseudocode, is performed on the value in the heap, H.

```
While ( H has more than one value) {
    min1 = extractMin(H);
    min2 = extractMin(H);
    InsertValue( H , max{min1,min2}+1);
}
    return extractMin( H ); /* Return the single remaining value in H .*/
```

End Algorithm

The above procedure computes the upper bound on information content, which is the best possible among all possible orderings of operations. Among all possible orderings of operations in an expression representing sum of constant multiples of inputs, the ordering defined by the Huffman Rebalancing algorithm gives the tightest possible upper bound on information content of expression result. If the Huffman rebalancing results in a change in topology, merging should be reattempted otherwise the procedure may be terminated—step S230. The other procedures for bitwidth reduction based on required precision and required information content may be applied as well in the procedure of FIG. 7 immediately between steps S230 and S215.

Figure 8:
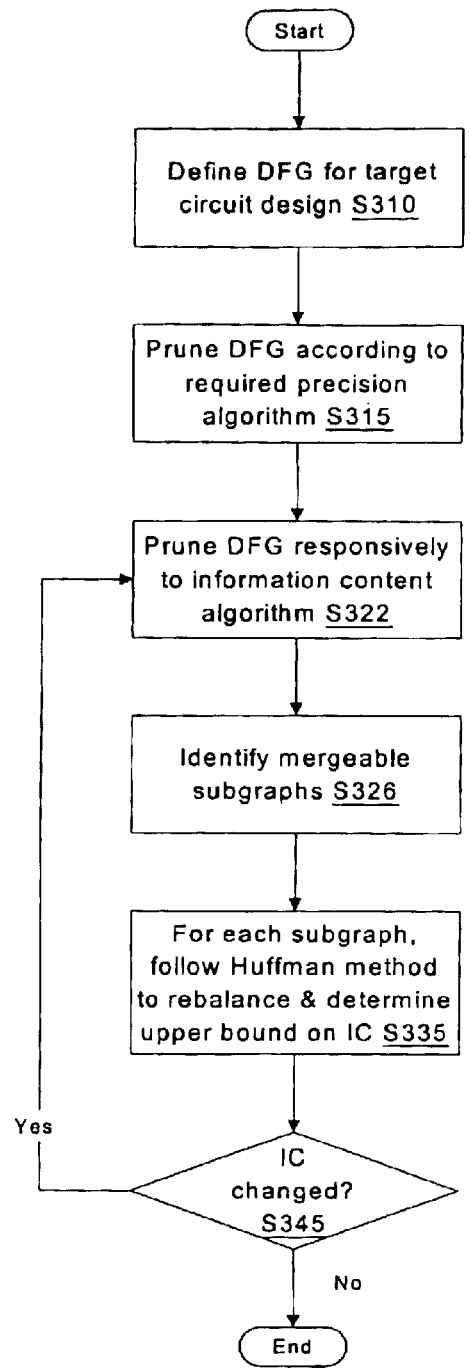
FIG. 8 is a flow chart illustrating an iterative procedure for determining maximal clusters.

Referring now to FIG. 8, the overarching problem of partitioning a DFG into clusters may employ each of the above measures in a single algorithm for computing maximal clusters based on the analyses of required precision and information content. The algorithm illustrated in FIG. 8 involves an iterative bottom-up traversal (outputs to inputs) of the DFG and identifies break nodes i.e. every operator node N such that N is not mergeable with at least one of the operators at the destination of its outedges. This defines a partitioning of the graph into clusters, which are connected components obtained by removing those outedges of every break node whose destination nodes are not operator nodes. Assuming that a DFG has been transformed based on analysis of required precision and information content, an operator node N of the DFG, is a break node if one or more of following conditions hold:

1. Safety Condition 1: For some outedge of the operator node N, the destination node of the outedge is an extension node.
2. Safety Condition 2: Let $p_i; \ldots ;p_m$ be the destination ports of outedges of the operator node. Let $r(p_i)$ denote the required precision of signal for each $p_i$. Then min $\{i_{int}(N); \max \{(p_i); \ldots ;r(p_m)\}\} \leq w(N)$.
3. Synthesizability Condition 1: For some outedge of N, the destination node has multiplication operator.
4. Synthesizability Condition 2: There is a node N' such that every directed path starting at N goes through N' and there are no break nodes between N and N' on any of these paths.

Synthesizability condition 2 ensures that every cluster has a unique operator node providing outputs; synthesizability condition 1 ensures that this unique output is expressible as sum of products of inputs to the cluster. Then each cluster can be synthesized as a sum of addends.

If the algorithm for information content computation encounters an extension node, created by the previous iteration of information content computation, it needs to propagate information content across the extension node. If N is an extension node and <i,t> are upper bounds on information content at its input port and e is the inedge of N, then an upper bound $<i_o, t_o>$ on the output port of N can be defined as follows.

(i) if ((t==t(N)) OR ((t==unsigned) AND (t(N)==signed))) then $i_o$=min $\{i; w(N)\}$; $t_o$=t(N);

(ii) if ((t==signed) AND (t(N)==unsigned)) then $i_o$=min $\{w(e); w(N)\}$; $t_o$=(N);

After initial computation of required precision and information content, the algorithm for maximal merging enters an iterative mode. Every iteration defines a partitioning based on current values of information content and uses current set of clusters to compute tighter upper bounds on the information content of the output signals of clusters. Whenever the value of information content of the output signals of any cluster change, another iteration of cluster definition is done with the anticipation that smaller information content could lead to more mergeability and result in bigger and fewer clusters. This way the algorithm converges to a partitioning with maximal safe clusters.

A simple procedure for implementing the above method is outlined in FIG. 8. First, a DFG is defined for some target circuit design (S315). Next, in steps S315 and S322, the DFG is pruned responsively to required precision and information content upper bounds. Preferably, this may be done using the algorithms defined above or parts thereof. Next, in step S326, mergeable subgraphs may be identified in the DFG. Next, in step S335, the potentially mergeable subgraphs are rebalanced and upper bound on information content determined. Steps S322–S335 are repeated the first time S345 is encountered and if information content remains unchanged afterward, the process is terminated otherwise, steps S322–S335 are repeated again until the information content upper bounds remains unchanged for all clusters. Note that only a subset of clusters need be handled as required by the loop defined above. Note also that the required precision step S315 may be omitted and the benefit of information content and rebalancing obtained without it. Also, other techniques for rebalancing, determining information content, and/or required precision may be substituted in the process of FIG. 8.

The DFG partitioning algorithm was implemented and tested as a DFG optimization and datapath operator-merging step in the BuildGates synthesis tool of Cadence Design Systems. Datapath intensive RTL test cases were used and experimental data collected on the performance of the algorithm. These were compared with results obtained using an older implementation of cdfg partitioning algorithm. The older algorithm did mergeability analysis using criteria similar to "leakage of bits" approach and without doing any transformations based on information content and required precision.

Using the TSMC 0.25-micron technology cell library, two types of performance data were collected:

(i) Longest path delay and area of the netlists obtained after synthesis but before any timing driven gate level logic optimization.

(ii) Runtime of timing driven gate level logic optimization done on netlists obtained from synthesis.

Tables 1 and 2 respectively present the above two types of data from five datapath-only test cases. To highlight the impact of operator merging in datapath synthesis, Table 1 also includes the data obtained using a synthesis flow which does not do any operator merging. When the non operator-merging based flow was used, the runtimes of logic optimization were much larger than those with operator-merging based flows; so runtime was not included in Table 2. To further compare of the quality of the final netlists generated using old and new merging algorithm, Table 2 includes the data on final longest path delay and final area after timing driven logic optimization. All delay numbers are in nanoseconds and the area numbers are scaled down by a factor of 100. Note that to collect data for both tables, we set the arrival times at all inputs in each test case to 0.

TABLE 1

| Test cases | | $D_1$ | $D_2$ | $D_3$ | $D_4$ | $D_5$ |
|---|---|---|---|---|---|---|
| Del. (ns) | No mg | 14.47 | 18.01 | 33.59 | 29.23 | 25.89 |
| | Old mg | 13.04 | 11.97 | 29.90 | 28.13 | 25.89 |
| | New mg | 12.73 | 11.07 | 29.27 | 16.97 | 15.57 |
| | % red. | 2.38 | 7.52 | 2.11 | 39.67 | 39.86 |

TABLE 1-continued

| Test cases | | $D_1$ | $D_2$ | $D_3$ | $D_4$ | $D_5$ |
|---|---|---|---|---|---|---|
| Area (unit) | No mg | 93.8 | 79.3 | 1866 | 490 | 279 |
| | Old mg | 91.7 | 66.6 | 501 | 397 | 225 |
| | New mg | 90.3 | 66.6 | 476 | 43 | 33.3 |
| | % red. | 1.53 | 0 | 5 | 89.2 | 85.2 |

TABLE 2

| Test cases | | $D_1$ | $D_2$ | $D_3$ | $D_4$ | $D_5$ |
|---|---|---|---|---|---|---|
| Target delay (ns) | | 5.0 | 4.0 | 21.0 | 10.5 | 14.0 |
| Opt time delay (sec) | Old mg | 470 | 1031 | 26 | 118 | 21 |
| | New mg | 6.8 | 208 | 17 | 2.2 | 1.3 |
| | % red. | 98.5 | 79.8 | 34.6 | 98.1 | 93.8 |
| End Del | Old mg | 4.99 | 4.35 | 20.7 | 10.5 | 13.9 |
| | New mg | 4.99 | 3.98 | 20.9 | 9.1 | 12.2 |
| End Area | Old mg | 161 | 155 | 377 | 609 | 259 |
| | New mg | 142 | 118 | 363 | 44 | 35 |

Test case $D_1$ and $D_2$ were created using multiple addition operations, which are potentially mergeable. These addition operations did not have any redundant widths in RTL code, so the first pass of information-analysis leads to clusters that are not distinguishable from those created by the old merging algorithm. However, the post-clustering information analysis based on optimal reordering of operations, which is done by the second or subsequent iteration of the new merging algorithm, allows the inference of smaller information content for output signals of clusters. This allows the second or subsequent iterations to merge the set of clusters created in previous iteration into bigger and fewer clusters. This reduction in number of clusters, leads to the better longest path delay and area values after initial synthesis. Since there were no apparent redundant widths in RTL, the gains seen after the initial synthesis do not seem as large as $D_4$ and $D_5$. Nevertheless during timing driven logic optimization, we see considerable advantages of creating larger clusters, and see significantly smaller runtimes.

Test cases $D_4$ and $D_5$ were created with a great deal of redundancy in the bit widths of intermediate paths in RTL, to test the effect of information-analysis based width reduction on timing and area of netlists. In these test cases, the merging algorithm was able to prune the redundant widths to the minimum required, and this in turn helped in reducing the number of clusters created. As a result, significant reduction in longest path delay and area after the initial synthesis was noted. This also translates to drastic reduction in the runtime of the timing driven logic optimization for these two test cases, as seen in Table 2.

Test case $D_3$ represented a sum of products of sum computation, where information-based-analysis allowed the new merging algorithm to prune with widths of outputs of products and merge them with the final addition.

The above results demonstrate the benefits of using analyses of required precision and information content of signals in DFGs for operator merging based datapath synthesis.

Figure 9:
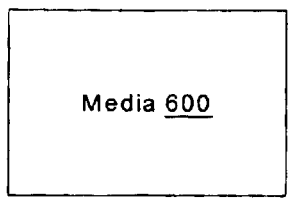
FIG. 9 is a generic illustration of media that may be used for storing algorithms.

Referring to FIG. 9, any of the methods, algorithms, or techniques presented may be embodied in software and stored on media 600 according to known techniques.

Although the foregoing invention has been described by way of illustration and example, it will be obvious that certain changes and modifications may be practiced that will still fall within the scope of the appended claims. The devices and methods of each embodiment can be combined with or used in any of the other embodiments. For another example, the concepts of required precision, information content, the related transformations, and the partitioning algorithms described below are applicable to data flow graphs (DFGs) that have datapath operators other than addition, subtraction, unary minus and multiplication e.g. comparators and shifters. However, for the sake of clarity the discussion is limited to examples involving +, − and × operations.

The following references are hereby incorporated by reference as if fully set forth herein in their entirety.

D. A. Huffman, A method for the construction of minimum-redundancy codes, Proceedings of the IRE, 40(9), 1952, pp. 1098{1101.

T. Kim, W. Jao, S. Tjiang, \Arithmetic Optimization using Carry-Save-Adders", Proceedings of the 35th Design Automation Conference, 1998, pp.433–438.

A. R. Omondi, \Computer Arithmetic Systems: Algorithms, Architectures and Implementations", Prentice-Hall International Series in Computer. Science, 1998.

J. Um, T. Kim, C. L. Liu, \Optimal Allocation of Carry-Save-Adders in Arithmetic Optimization" Proceedings of International Conference on Computer Aided Design, 1999, pp.410–413.

J. Um, T. Kim, C. L. Liu, "A Fine-Grained Arithmetic Optimization Technique for High-Performance/Low-Power Data Path Synthesis" Proceedings of the 37th Design Automation Conference, 2000, pp.98–103.

C. S. Wallace, \A suggestion for a fast multiplier" IEEE Trans. Electron. Comput., February 1964, vol EC-13, pp.14–17.

N. Weste, K. Eshraghian, "Principles of CMOS VLSI Design—A System Perspective" Addition Wesley Publishers, 1985.

M. Willems, V. Bursgens, H. Keding, T. Grotker, H. Meyr, "System Level Fixed-Point Design Based on an Interpolative Approach", Proceeding of the 34th Design Automation Conference, 1997, pp. 293–298.

What is claimed is:

1. A method of optimizing a computer model of a digital circuit, said model including a data flow graph (DFG), comprising:
   (a) determining a minimum bitwidth required for at least a portion of a directed path of said DFG responsively to a width of an output port of at least one operator, where said portion is in a fan-out direction relative to said output port;
   (b) determining information content of inputs of an operator of said DFG;
   (c) determining information content of an output port of said operator responsively to said information content of said inputs;
   (d) reducing a bitwidth of a portion of said DFG responsively to said information content of inputs and said information content of the output port.

2. The method of claim 1, further comprising:
   (e) identifying mergeable clusters of said DFG and determining an upper bound on an output of each of said mergeable clusters.

3. The method of claim 2, further comprising:
   (f) identifying additional mergeable clusters responsively to a result of said determining an upper bound.

4. The method of claim 3, further comprising:
   reducing bitwidths of portions of said DFG responsively to a result of said identifying additional mergeable clusters.

5. The method of claim 4, further comprising: repeating (b), (c), (d), (e), (f), and (g).

6. A method of optimizing a data flow graph representing a logical circuit design, comprising:
   (a) reducing bitwidths of data flow paths responsively to required precision of outputs of operators of said DFG;
   (b) reducing bitwidths of operators and outputs responsively to information content of inputs of said operators;
   (c) merging operators of said DFG responsively to said first and second reducing to generate definitions of clusters;
   (d) calculating information content upper bound for outputs of said clusters; reducing bitwidths of said DFG responsively to said step of calculating; and
   (e) repeating said reducing bitwidths of operators and outputs.

7. A computer readable medium encoding instructions which, when executed, cause a processor to perform a method of optimizing a computer model of a digital circuit, said model including a data flow graph (DFG), comprising:
   (a) determining a minimum bitwidth required for at least a portion of a directed path of said DFG responsively to a width of an output port of at least one operator, where said portion is in a fan-out direction relative to said output port;
   (b) determining information content of inputs of an operator of said DFG;
   (c) determining information content of an output port of said operator responsively to said information content of said inputs;
   (d) reducing a bitwidth of a portion of said DFG responsively to said information content of inputs and said information content of the output port.

8. The computer readable medium of claim 7, said method further comprising: identifying mergeable clusters of said DFG and determining an upper bound on an output of each of said mergeable clusters.

9. The computer readable medium of claim 8, said method further comprising: identifying additional mergeable clusters responsively to a result of said determining an upper bound.

10. The computer readable medium of claim 9, said method further comprising reducing bitwidths of portions of said DFG responsively to a result of said identifying additional mergeable clusters.

11. The computer readable medium of claim 10, said method further comprising: repeating said (b), (c), (d), (e), (f), and (g).

12. A computer readable medium encoding instructions which, when executed, cause a processor to perform a method of optimizing a data flow graph representing a logical circuit design, comprising:
   (a) reducing bitwidths of data flow paths responsively to required precision of outputs of operators of said DFG;
   (b) reducing bitwidths of operators and outputs responsively to information content of inputs of said operators;
   (c) merging operators of said DFG responsively to said first and second reducing to generate definitions of clusters;
   (d) calculating information content upper bound for outputs of said clusters;
   (e) reducing bitwidths of said DFG responsively to said calculating; and
   (f) repeating said second reducing.

* * * * *